(12) United States Patent
Kim et al.

(10) Patent No.: US 8,476,707 B2
(45) Date of Patent: Jul. 2, 2013

(54) METHOD FOR MANUFACTURING SEMICONDUCTOR DEVICE

(75) Inventors: Joong Sik Kim, Yongin-si (KR); Sung Woong Chung, Icheon-si (KR)

(73) Assignee: Hynix Semiconductor Inc., Icheon (KR)

( * ) Notice: Subject to any disclaimer, the term of this patent is extended or adjusted under 35 U.S.C. 154(b) by 0 days.

(21) Appl. No.: 13/296,919

(22) Filed: Nov. 15, 2011

(65) Prior Publication Data

US 2012/0061760 A1    Mar. 15, 2012

Related U.S. Application Data

(62) Division of application No. 12/495,702, filed on Jun. 30, 2009, now Pat. No. 8,115,255.

(30) Foreign Application Priority Data

Jul. 14, 2008 (KR) .......................... 10-2008-0068126

(51) Int. Cl.
*H01L 29/06* (2006.01)

(52) U.S. Cl.
USPC .................................. 257/347; 257/E29.022

(58) Field of Classification Search
None
See application file for complete search history.

(56) References Cited

U.S. PATENT DOCUMENTS

| 2004/0217434 A1 | 11/2004 | Lee et al. |
| 2005/0098094 A1 | 5/2005 | Oh et al. |
| 2005/0194616 A1 | 9/2005 | Yoon et al. |
| 2009/0008705 A1* | 1/2009 | Zhu et al. .................... 257/327 |

FOREIGN PATENT DOCUMENTS

| KR | 1019990038114 A | 6/1999 |
| KR | 1020040094498 A | 11/2004 |
| KR | 1020050044140 A | 5/2005 |
| KR | 1020050089221 A | 9/2005 |

* cited by examiner

*Primary Examiner* — Benjamin Sandvik

(57) ABSTRACT

A method for manufacturing a semiconductor device comprises including a insulating pattern and a silicon film over a SOI substrate, thereby increasing a reduced volume of a floating body after forming a floating body fin transistor so as to secure a data storage space. The method comprises: forming a insulating pattern and a first silicon film over an upper silicon film of a SOI substrate; and forming a fin structure in the first silicon film.

6 Claims, 5 Drawing Sheets

METHOD FOR MANUFACTURING SEMICONDUCTOR DEVICE

CROSS-REFERENCE TO RELATED APPLICATION

The priority of Korean patent application No. 10-2008-0068126 filed Jul. 14, 2008, the disclosure of which is hereby incorporated in its entirety by reference, is claimed.

BACKGROUND OF THE INVENTION

The present invention relates to a method for manufacturing a semiconductor device and more specifically to a fin transistor.

In a system with a plurality of semiconductor devices, a semiconductor memory is configured to store data generated or processed therein. For example, if a request from a data processor such as a central processing unit (CPU) is received, the semiconductor memory outputs data to the data processor from unit cells therein or stores data processed by the data processor to the unit cells, according to an address transmitted with the request.

Recently, the data storage capacity of the semiconductor memory has increased, but the size of the semiconductor memory chip has not increased proportionally. Thus, various elements and components used for read or write operations in the semiconductor memory have also reduced in size. Accordingly, components and elements duplicated unnecessarily in the semiconductor memory, such as transistors or wires, are combined or merged to lessen the area occupied by each component. Particularly, the reduction of the size of unit cells included in the semiconductor memory apparatus affects the level of integration.

A common type of semiconductor memory is Dynamic Random Access Memory (DRAM). DRAM is a type of volatile memory device configured to retain data while a power source is supplied. The unit cell comprises a transistor and a capacitor. As the design rule is reduced, the plane area where a capacitor can be formed is reduced. In order to stably store data, it is necessary to maintain the capacitance even with a shrinking capacitor. It is difficult to develop materials for creating an insulating film in the capacitor in order to improve the capacitance of the capacitor having a reduced area.

Also, as the design rule is reduced, the junction resistance value of the storage node (SN) and the turn-on resistance value of the transistor in the unit cell are increased; it becomes difficult to perform normal read and write operations; and refresh characteristics are deteriorated.

In order to improve the above-described shortcomings, a floating body transistor has been developed. That is, the unit cell of the semiconductor memory apparatus does not include a capacitor used for storing data, but stores data as a floating charge in the body of the transistor included in the unit cell. Due to the application of the floating body transistor, the unit cell is not required to include a capacitor. As a result, the unit cell size can be reduced.

However, the continuous reduction of the design rule limits the size of the floating body transistor. As a result, the length of the channel between the source and drain region in the floating body transistor becomes shorter.

Meanwhile, in order to enlarge the channel length of the transistor, a fin transistor that has a three-dimensional channel region is used. In order to prevent a short channel effect in the floating body transistor, a method for manufacturing the fin transistor that has a three-dimensional channel region over a silicon-on-insulator (SOI) substrate is used.

FIGS. 1a and 1b are cross-sectional diagrams illustrating a method for manufacturing a fin cell transistor formed over a SOI substrate of a semiconductor device.

Referring to FIG. 1a, a fin transistor is formed over a SOI substrate including a lower semiconductor substrate 110, a buried insulating film 120 and an upper silicon film 130. The fin transistor includes a portion of the upper silicon film 130 as a body, and further includes a gate pattern including a gate insulating film 140, a lower gate electrode 150, an upper gate electrode 160 and a gate hard mask insulating film 170. A spacer 180 is formed at sidewalls of the gate pattern. Impurities are doped at both sides of the gate pattern of the upper silicon film 130 to form a source and drain 190.

Although the lower gate electrode 150 of FIG. 1a obscures a fin region of the transistor, FIG. 1b that shows a cross-sectional view of I-I' which illustrates a location of a fin region 130'. The fin region 130' having a fin type for connecting the source and drain 190 disposed at both sides of the gate pattern is obtained by partially etching the upper silicon film 130, and surrounded by the gate insulating film 140 and the lower gate electrode 150. In the fin transistor, a channel is formed in the fin region 130' depending on a potential of the lower gate electrode 150. The channel is formed to have a three-dimensional structure, thereby reducing a short channel effect. That is, the channel is formed to have a long length between the source and drain regions by using the three-dimensional fin region 130'. As a result, the channel length can be increased longer than a two-dimensional channel length.

However, the formation of the fin region 130' reduces the size of the floating body of the floating body transistor in the SOI structure. In order to improve storage data, particularly a refresh characteristic, it is preferable to enlarge the volume of the floating body where data can be stored. However, the formation of the fin region 130' inevitably reduces the volume of the floating body, which reduces the amount of charge that can be stored.

The SOI substrate includes an insulating film disposed between a semiconductor substrate and a silicon film so that the SOI substrate has the same characteristic as a capacitor structure. When charges move repeatedly through the body of the transistor, the charges are accumulated in the capacitor through generation and recombination of a bias and a carrier. The charges accumulated in the capacitor fluctuate a threshold voltage of the transistor and this is used to measure whether data is stored in the capacitor. Kink effect refers to a generation phenomenon of leakage current resulting from concentration of an electric field.

The floating body effect and Kink effect are affected by the amount of charges that can be accumulated in the floating body. When holes are continuously accumulated in the floating body due to data storage, a depletion region which becomes larger as the volume of the floating body becomes smaller is diffused in a shorter time period. As a result, the holes corresponding to data cannot be stored in the floating body transistor any longer.

BRIEF SUMMARY OF THE INVENTION

Various embodiments of the invention relate to a method for manufacturing a semiconductor device.

According to an embodiment of the present invention, a method for manufacturing a semiconductor device comprises: forming a partial insulating film and a first silicon film over an upper silicon film of a SOI substrate; and forming a fin region in the first silicon film.

Preferably, the method further comprises: forming a gate insulating over the fin region; and forming a gate pattern over the gate insulating film.

Preferably, the forming-a-gate-pattern-over-the-gate-insulating-film includes: forming a lower gate electrode over the gate insulating film; forming an upper gate electrode over the lower gate electrode; and forming a gate hard mask insulating film over the upper gate electrode.

Preferably, a spacer is formed at sidewalls of the gate pattern.

Preferably, the first silicon film is doped with impurities at both sides of the gate pattern.

Preferably, the partial insulating film and the fin region are not overlapped.

Preferably, the partial insulating film includes a silicon oxide ($SiO_2$) film.

According to an embodiment of the present invention, a semiconductor device comprises: an active region including a partial insulating film and a first silicon film over a SOI substrate; a fin region formed in the active region; and a gate pattern formed over the fin region.

Preferably, the partial insulating film is formed between the SOI substrate and the first silicon film, and the active region is formed in the first silicon film formed over the partial insulating film and the SOI substrate.

Preferably, the partial insulating film and the fin region are not overlapped.

Preferably, the partial insulating film includes a silicon oxide ($SiO_2$) film.

Preferably, the gate pattern includes a lower gate electrode, an upper gate electrode and a gate hard mask insulating film.

Preferably, a spacer is formed at sidewalls of the gate pattern.

Preferably, the semiconductor device further comprises a source and a drain formed at both sides of the gate pattern.

DESCRIPTION OF EMBODIMENTS

FIGS. 2a to 2f are cross-sectional diagrams illustrating a method for manufacturing a fin cell transistor in a semiconductor device according to an embodiment of the present invention.

Figure 1A:
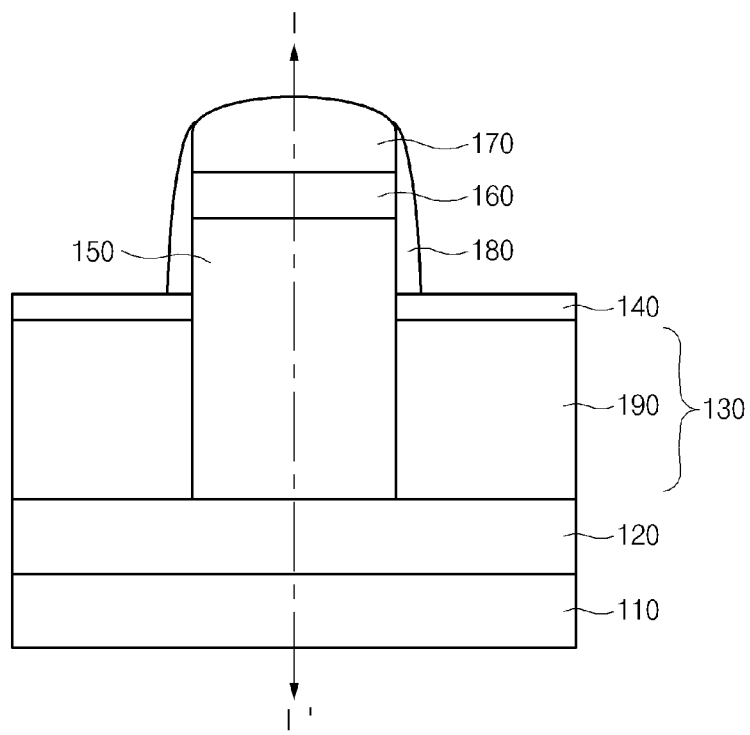
FIGS. 1a and 1b are cross-sectional diagrams illustrating a method for manufacturing a fin cell transistor formed over a SOI substrate of a general semiconductor device.
Figure 1B:
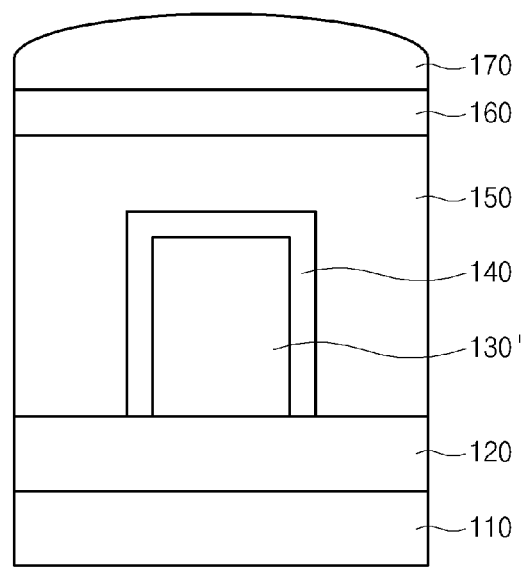
Figure 2A:
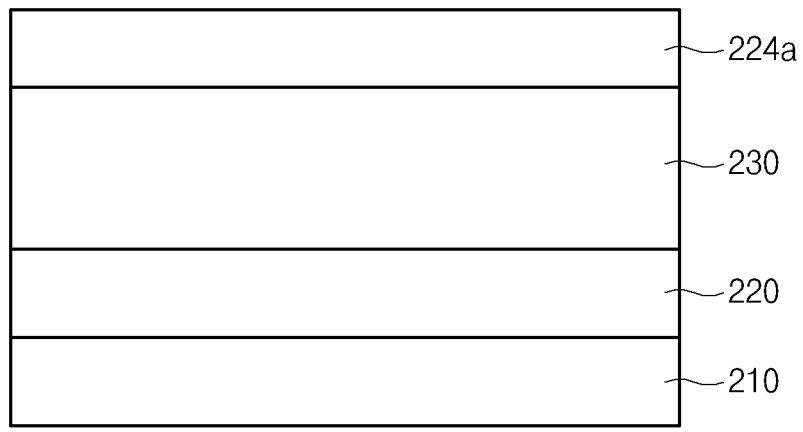
FIGS. 2a to 2f are cross-sectional diagrams illustrating a method for manufacturing a fin cell transistor in a semiconductor device according to an embodiment of the present invention.
Figure 2B:
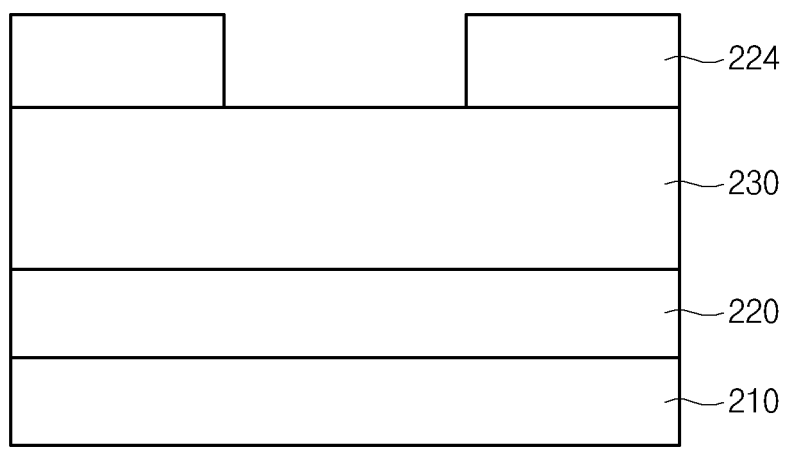

Referring to FIG. 2a, an insulating film 224a is formed over a SOI substrate including a lower semiconductor substrate 210, a buried insulating film 220 and an upper silicon film 230. As shown in FIG. 2b, a portion of the insulating film 224a is etched to form a partial insulating film 224. The partial insulating film 224 may include a silicon oxide ($SiO_2$) film.

Figure 2C:
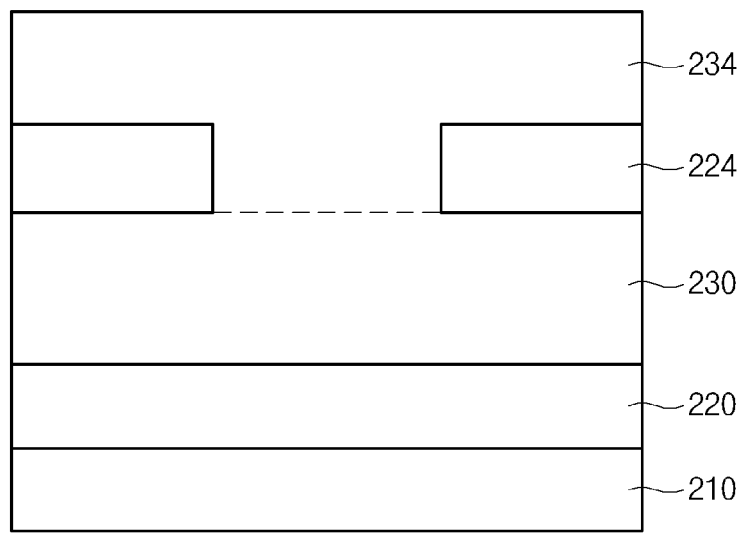

Referring to FIG. 2c, a selective epitaxial growth (SEG) process is performed over the insulating films 224, thereby obtaining a first silicon film 234. Through this process, the partial insulating film 224 and the first silicon film 234 are formed over the upper silicon film 230 of the SOI substrate. An active region (not shown) is defined with an ISO mask.

Figure 2D:
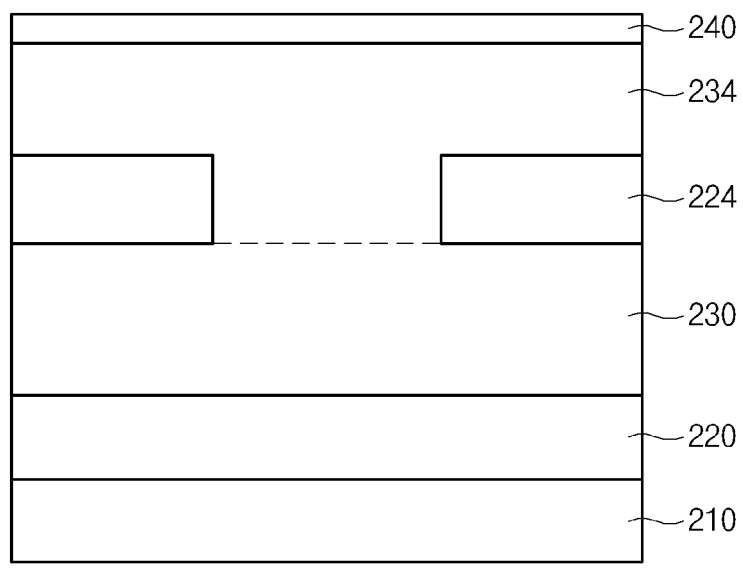

Referring to FIG. 2d, a gate insulating film is deposited over the first silicon film 234. The active region is etched with a fin mask to form a fin-shaped channel region (not shown) When the active region is formed to obtain a fin region, the bottom portion of the partial insulating film 224 is etched to have a space where a lower gate electrode may be formed in a subsequent process.

Figure 2E:
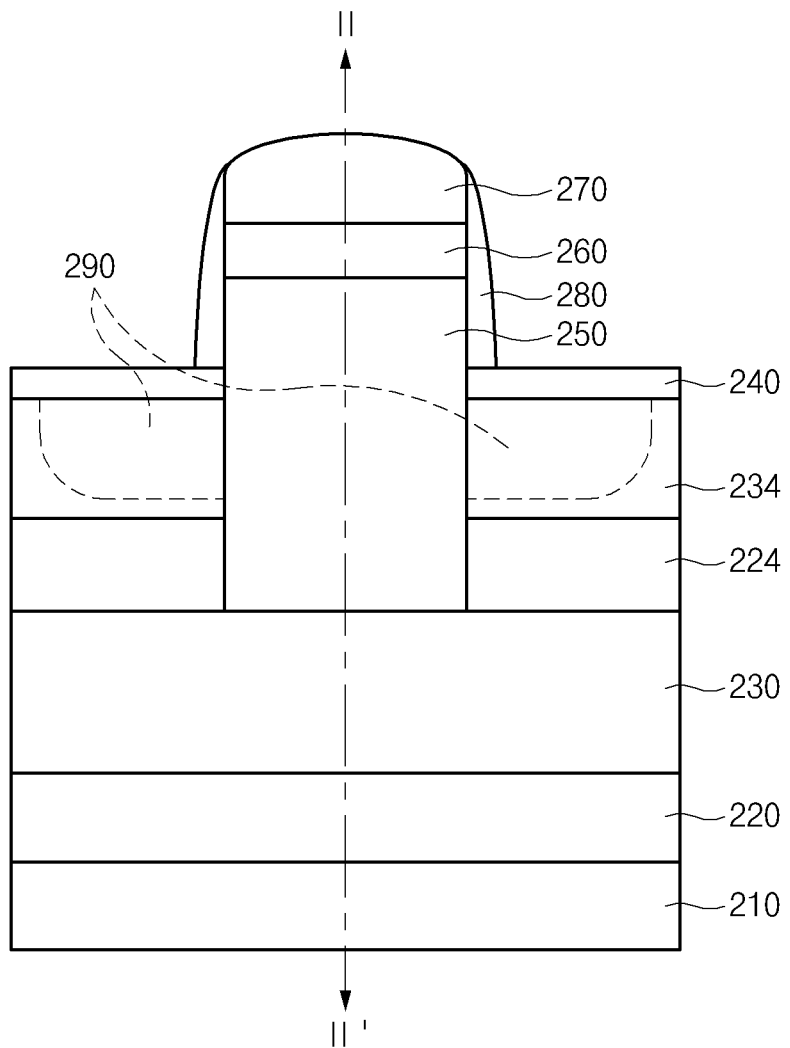

As shown in FIG. 2e, a lower gate electrode 250 that covers the fin region is formed. A upper gate electrode 260 is formed over the lower gate electrode 250. A gate hard mask insulating film 270 is formed over the upper gate electrode 260, thereby obtaining a gate pattern. Although the gate pattern includes a plurality of electrodes, i.e., the lower gate electrode and the upper gate electrode, it is possible to form a gate including a single electrode in another embodiment.

A spacer 280 is formed at sidewalls of the gate pattern. The spacer 280 may include a nitride film. A first silicon film 234 is doped with impurities at both sides of the gate pattern, thereby obtaining a source and drain region 290. Through the above-described process, the partial insulating film is formed over the SOI substrate, and a floating body fin transistor may be formed over the partial insulating film.

Figure 2F:
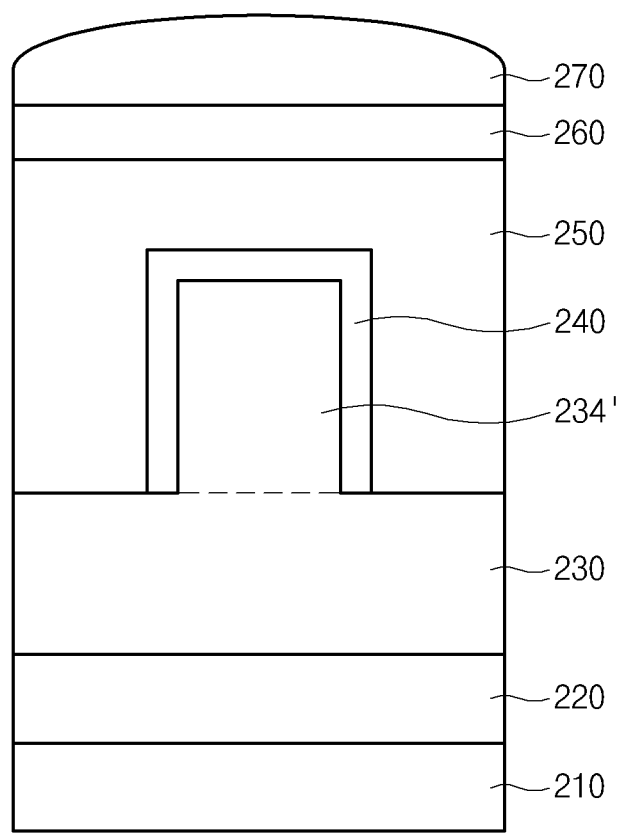

FIG. 2f shows a cross-sectional view of II-II' in FIG. 2e and illustrates a fin region 234' formed between the source and drain region 290. The partial insulating film 224 and the fin region 234' are not overlapped in the plane and cross-sectional diagram. When the partial insulating film 224 and the fin region 234' are overlapped or contact with each other, it cannot secure the stability of the operation of the semiconductor device. As a result, the partial insulating film 224 and the fin region 234' are required to be separated.

The semiconductor device formed through the above-described processes comprises the partial insulating film 224 formed over the SOI substrate, the active region including the first silicon film 234, the fin region 234' formed in the active region, and the gate pattern formed over the fin region 234'. The partial insulating film 224 and the fin region 234' are not overlapped. Also, the gate pattern may include a lower gate electrode, an upper gate electrode, and a gate hard mask insulating film. The gate pattern may not include a plurality of gate electrodes but a single gate electrode. The source/drain region of the semiconductor device is formed at both sides of the gate pattern in the first silicon film 234.

Referring to FIGS. 2e and 2f, the fin region 234' is formed in the first silicon film 234 grown by the SEG method so that it is possible to secure a space for storing holes corresponding to data due to the upper silicon film 230 connected to the bottom portion of the fin region 234' although the continuous operation of the semiconductor device causes a full depletion state by diffusion of a depletion region in the fin region 234'. That is, in the conventional art, the formation of the fin region reduces the volume of the floating body to decrease the time the stored charge reaches the full depletion state, so that data can be lost in the semiconductor device. However, in the present invention, the upper silicon film 230 as well as the fin region 234' are further formed over the SOI substrate so as to prevent a full depletion state from the floating body. When a floating body fin transistor of the present invention is applied in a unit cell of a semiconductor device, a data retention time may be maintained, and the operation stability of the semiconductor device may be improved.

The above embodiments of the present invention are illustrative and not limitative. Various alternatives and equivalents are possible. The invention is not limited by the type of deposition, etching polishing, and patterning steps describe herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A semiconductor device, comprising:
   an insulating pattern provided over an upper silicon film of a silicon on insulator (SOI) substrate;
   a first silicon film provided over the insulating pattern and the upper silicon film;
   a fin structure formed in the first silicon film; and
   a gate electrode formed over the fin structure,
   wherein the first silicon film defines a source region on a first side of the gate electrode and a drain region on a second side of the gate electrode,
   wherein the source and drain regions are separated from the upper silicon film by the insulating pattern, and
   wherein the gate electrode contacts the upper silicon film via an opening of the insulating pattern.

2. The device of claim 1, wherein the insulating pattern has an opening exposing the SOI substrate, the first silicon film being provided over the insulating pattern and contacting the SOI substrate through the opening.

3. The device of claim 1, wherein the fin structure defines at least three surfaces and the gate electrode formed over at least the three surfaces of the fin structure.

4. The semiconductor device according to claim 1, wherein the insulating pattern and the fin structure do not overlap.

5. The semiconductor device according to claim 4, wherein the gate electrode is part of a gate structure including a lower gate electrode, an upper gate electrode and a gate hard mask insulating film, the gate electrode being the lower gate electrode of the gate structure.

6. The semiconductor device according to claim 5, wherein a spacer is formed at sidewalls of the gate structure.

\* \* \* \* \*